(12) United States Patent
Chun et al.

(10) Patent No.: US 9,634,284 B2
(45) Date of Patent: Apr. 25, 2017

(54) DISPLAY DEVICE INCLUDING A PROTECTION FILM HAVING NANOBEADS

(71) Applicant: SAMSUNG DISPLAY CO., LTD., Yongin, Gyeonggi-Do (KR)

(72) Inventors: Yong Hoon Chun, Cheonan-si (KR); Soon Ryong Park, Sejong-si (KR); Seok Gi Baek, Yongin-si (KR); Jung Ho So, Cheonan-si (KR); Chul Woo Jeong, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 83 days.

(21) Appl. No.: 14/446,257

(22) Filed: Jul. 29, 2014

(65) Prior Publication Data
US 2015/0115248 A1   Apr. 30, 2015

(30) Foreign Application Priority Data
Oct. 30, 2013 (KR) .......... 10-2013-0130532

(51) Int. Cl.
*H01L 51/52* (2006.01)
*H01L 51/00* (2006.01)

(52) U.S. Cl.
CPC ...... *H01L 51/5253* (2013.01); *H01L 51/0097* (2013.01); *H01L 2251/5338* (2013.01); *Y02E 10/549* (2013.01)

(58) Field of Classification Search
CPC ............ H01L 51/0097; H01L 51/5243; H01L 51/5246; H01L 51/5253; H01L 2251/5338
See application file for complete search history.

(56) References Cited

U.S. PATENT DOCUMENTS

| 2003/0068486 A1* | 4/2003 | Arney ............... C03C 17/007 428/323 |
| 2007/0125181 A1* | 6/2007 | Ofek ................... B82Y 5/00 73/778 |
| 2008/0176041 A1* | 7/2008 | Sato ................ H01L 51/0097 428/161 |
| 2009/0002832 A1* | 1/2009 | Tochigi .............. G02B 5/0226 359/599 |
| 2009/0279176 A1* | 11/2009 | Wang .................. B82Y 20/00 359/601 |
| 2014/0183473 A1* | 7/2014 | Lee ................. H01L 51/0097 257/40 |
| 2014/0217373 A1* | 8/2014 | Youn ............... H01L 27/3276 257/40 |

FOREIGN PATENT DOCUMENTS

| KR | 10-0967362 B1 | 6/2010 |
| KR | 10-1217768 B1 | 1/2013 |
| KR | 10-2013-0051230 A | 5/2013 |
| KR | 10-2014-0045837 | 4/2014 |
| KR | 10-2014-0136762 | 12/2014 |

* cited by examiner

*Primary Examiner* — Eduardo A Rodela
*Assistant Examiner* — Christopher M Roland
(74) *Attorney, Agent, or Firm* — Lewis Roca Rothgerber Christie LLP

(57) ABSTRACT

A display device includes a display panel configured to display an image, and a protection film coupled to a lower portion of the display panel. The protection film includes a support film contacting the display panel and a stress control layer below the support film, and the stress control layer includes a plurality of nanobeads.

16 Claims, 5 Drawing Sheets

DISPLAY DEVICE INCLUDING A PROTECTION FILM HAVING NANOBEADS

CROSS-REFERENCE TO RELATED APPLICATION

This application claims priority to and the benefit of Korean Patent Application No. 10-2013-0130532, filed in the Korean Intellectual Property Office on Oct. 30, 2013, the entire content of which is incorporated herein by reference.

BACKGROUND

1. Field

Aspects of embodiments of the present invention are directed toward a display device.

2. Description of the Related Art

An organic light emitting diode display includes organic light emitting diodes including a hole injection electrode, an organic emission layer, and an electron injection electrode. Each organic light emitting diode emits light due to energy generated when an exciton, generated when an electron and a hole are coupled with each other in the organic emission layer, falls from an excited state to a ground state.

Because the organic light emitting diode deteriorates due to external factors such as external moisture, oxygen, and/or ultraviolet rays, a packaging technique of sealing the organic light emitting diode is utilized. Also, the organic light emitting diode display should be manufactured to be thin and/or easily bent so as to be applied to various applications.

Stress is generated when bending the organic light emitting diode display, and in more detail, tension stress is generated at a convex outside portion of the organic light emitting diode display, and compression stress is generated at a concave inside portion thereof.

Because the organic light emitting diode display has a layered structure made of complex materials, due to a difference between the tension stress and the compression stress at the outside and the inside of a bending portion, an asymmetrical phenomenon of a strain occurs, and as a result, a screen error is generated.

The above information disclosed in this Background section is only for enhancement of understanding of the background of the invention, and therefore, it may contain information that does not form the prior art that is already known in this country to a person of ordinary skill in the art.

SUMMARY

Aspects of embodiments of the present invention are directed toward a display device that controls a neutral plane by controlling an elastic coefficient of a protection film.

An example embodiment of the present invention includes a display device including: a display panel configured to display an image; and a protection film coupled to a lower portion of the display panel, in which the protection film includes a support film contacting the display panel and a stress control layer below the support film, and the stress control layer includes a plurality of nanobeads.

A surface of the stress control layer may include an uneven structure, and the uneven structure may include a protruding portion and a depression portion.

A group of the plurality of nanobeads may be agglomerated to form a neutral plane control portion, and the neutral plane control portion may be at (e.g., adjacent to) the protruding portion and/or the depression portion.

The neutral plane control portion may include a plurality of neutral plane control portions, and the plurality of neutral plane control portions may be spaced from each other.

The nanobeads may include a metal oxide.

The nanobeads may include at least one of aluminum oxide, silicon oxide, zinc oxide, zirconium oxide, magnesium oxide, or titanium oxide.

The stress control layer may include the nanobeads which may be mixed in at least one of a UV epoxy-based material, a urethane acrylate-based material, or an acrylate-based material.

The support film may include at least one of polyethylene terephthalate (PET), polypropylene (PP), polyethylene (PE), polyethersulfone (PES), or polycarbonate (PC).

A neutral plane may be in the display panel.

The display panel may be an organic light emitting panel.

The organic light emitting panel may include a flexible substrate coupled to the protection film, an organic light emitting diode on the flexible substrate, and a thin film encapsulation layer covering the organic light emitting diode.

An elastic coefficient of the stress control layer may be varied according to an amount of the nanobeads in the stress control layer.

An example embodiment of the present invention includes a display device including a protection film and an organic light emitting display panel. The organic light emitting display panel includes a thin film encapsulation layer, a flexible substrate between the thin film encapsulation layer and the protection film, and an organic light emitting diode between the flexible substrate and the thin film encapsulating layer. The protection film includes a stress control layer including a plurality of nanobeads and a support film between the display panel and the stress control layer.

An example embodiment of the present invention includes a method of forming a display device, the method includes forming a protection film to include a support film and a stress control layer including a plurality of nanobeads, and coupling the protection film to a lower portion of a display panel by contacting the support film to the display panel and arranging the stress control layer below the support film.

The forming of the protection film may include controlling an elastic coefficient of the stress control layer by varying an amount of the nanobeads in the stress control layer.

The forming of the protection film may include mixing a material forming the stress control layer and the plurality of nanobeads on the protection film; planarizing the protection film; and when the stress control layer has partially hardened, forming one side of the stress control layer to have an uneven structure utilizing a mold.

According to aspects of the example embodiment of the present invention, it is possible to control an elastic coefficient of a protection film by inserting nanobeads into the protection film. Accordingly, it is possible to reduce bending stress of the display device by controlling an elastic coefficient to control a position of a neutral plane.

DETAILED DESCRIPTION

Figure 1:
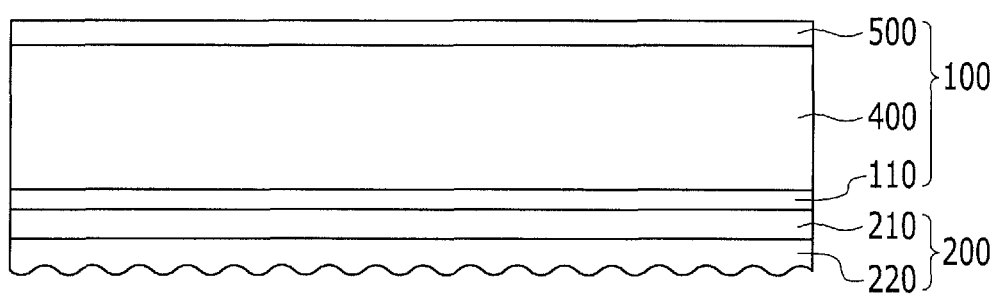
FIG. 1 is a cross-sectional view schematically illustrating an organic light emitting diode display according to an example embodiment of the present invention.

Hereinafter, example embodiments of the present invention will be described in detail with reference to the accompanying drawings. As those skilled in the art would realize, the described embodiments may be modified in various different ways, all without departing from the spirit or scope of the present invention. Example embodiments introduced herein are provided to make the disclosure thorough and complete and sufficiently transfer the spirit and scope of the present invention to those skilled in the art.

In the drawings, the thickness of layers, films, panels, regions, etc., may be exaggerated for clarity. It will be understood that when a layer is referred to as being "on" another layer or substrate, it may be directly on the other layer or substrate, or one or more intervening layers may also be present. Like reference numerals designate like elements throughout the specification.

As used herein, the singular forms "a", "an", and "the" are intended to include the plural forms as well, unless the context clearly indicates otherwise. It will be further understood that the terms "comprise", "include", and "have" used herein specify the presence of stated features or components, but do not preclude the presence or addition of one or more other features or components. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the example term "below" may encompass both an orientation of above and below. The device may be otherwise oriented (rotated 90 degrees or at other orientations), and the spatially relative descriptors used herein interpreted accordingly.

Further, in the accompany drawings, an active matrix (AM) organic light emitting diode display having a 2Tr-1Cap structure in which two thin film transistors (TFTs) and one capacitor are included in one pixel is illustrated, but the present invention is not limited thereto. Accordingly, the organic light emitting diode display may include a plurality of thin film transistors and one or more capacitors in one pixel, and may be formed to have various structures in which a separate wiring is further formed or an existing wiring is omitted. Here, the pixel is a minimum unit of displaying an image, and the organic light emitting diode display displays the image through the plurality of pixels.

Next, an organic light emitting diode display according to an example embodiment of the present invention will be described with reference to FIGS. 1 to 3. However, in order to sufficiently describe a protection film according to an example embodiment of the present invention, the protection film is described as being applied to the organic light emitting diode display, but the present invention is not limited thereto. The protection film according to an example embodiment of the present invention may be applied to other flexible display devices.

FIG. 1 is a cross-sectional view schematically illustrating an organic light emitting diode display according to an example embodiment of the present invention. FIG. 2 is an enlarged view of a protection film according to the example embodiment of the present invention. FIG. 3 is a cross-sectional view illustrating a bending state of the organic light emitting diode display shown in FIG. 1.

Figure 2:
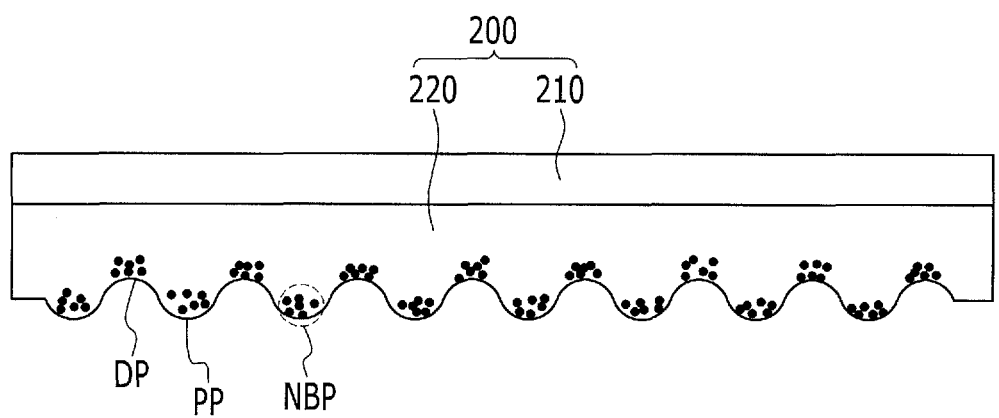
FIG. 2 is an enlarged view of a protection film according to the example embodiment of the present invention.
Figure 3:
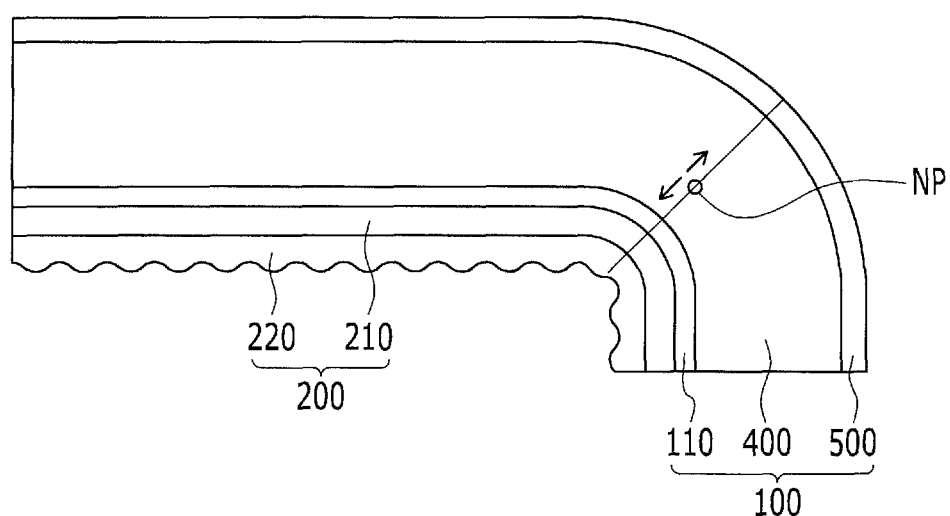
FIG. 3 is a cross-sectional view illustrating a bending state of the organic light emitting diode display shown in FIG. 1.

Referring to FIGS. 1 and 2, the organic light emitting diode display according to the example embodiment includes an organic light emitting display panel 100 configured to display or displaying an image, and a protection film 200 attached at a lower portion of the organic light emitting display panel 100. Here, the lower portion of the organic light emitting display panel 100 corresponds to a portion where an emission implementing layer 400 is disposed based on a flexible substrate 110 to be further described below (that is, the lower portion of the organic light emitting display panel 100 corresponds to the portion thereof at which the flexible substrate 110 is located).

The organic light emitting display panel 100 includes the flexible substrate 110, the emission implementing layer 400 disposed on the flexible substrate 110, and a thin film encapsulation layer 500 covering the emission implementing layer 400.

The flexible substrate 110 may be formed of a flexible film, such as a polyimide.

The emission implementing layer 400 may include a driving transistor for displaying an image, a switching transistor, an organic emission layer, and/or the like. The emission implementing layer 400 will be further described below in more detail with reference to FIGS. 4 to 6.

The thin film encapsulation layer 500 may prevent oxygen and moisture from flowing or penetrating into the emission implementing layer 400 from the outside.

The protection film 200 includes a support film 210 coupled to (e.g., contacting) the flexible substrate 110 of the organic light emitting display panel 100, and a stress control layer 220 disposed on an opposite surface in relation to a surface of the support film 210 which is coupled to (e.g., which contacts) the flexible substrate 110.

The support film 210 may include at least one of polyethylene terephthalate (PET), polypropylene (PP), polyethylene (PE), polyethersulfone (PES), and polycarbonate (PC).

The stress control layer 220 includes any one material selected from a UV (ultra-violet) epoxy-based material, a urethane acrylate-based material, and an acrylate-based material.

The stress control layer 220 may have an uneven structure (e.g., the stress control layer may have an uneven surface structure) including a protruding portion PP and a depression portion DP as illustrated in FIG. 2. The uneven structure efficiently distributes internal stress generated when the organic light emitting display panel 100 is bent. In the example embodiment, a plurality of nanobeads is included in the stress control layer 220. The nanobeads may have a very fine powder texture having a nano size formed by grinding the material.

When the organic light emitting diode display is bent, tension stress is generated at a convex outside portion thereof, compression stress is generated at a concave inside portion thereof, and a neutral plane (NP) where no force is generated exists at an intermediate region between the outside and the inside portions. When the organic light emitting diode is disposed on the neutral plane, a screen error of the organic light emitting diode display is not generated.

However, when a thickness of the organic light emitting diode display increases due to internal and external films, such as a polarization film and a protection film which are coupled to (e.g., attached to) the organic light emitting diode display, the tension stress and the compression stress are increased, and the neutral plane becomes narrow, and as a result, it is difficult to position the organic light emitting diode on the neutral plane.

The nanobeads, according to the example embodiment, include a metal oxide having a Young's modulus—representing an elastic coefficient—of 400 GPa or greater in order to control a position of the neutral plane in the organic light emitting display panel 100. Referring to FIG. 3, because the neutral plane moves toward a portion having a relatively high elastic coefficient, the nanobeads having a higher elastic coefficient than that of the organic light emitting display panel 100 where the neutral plane NP is disposed are included in the stress control layer 220 to lower the position of the neutral plane. Further, the elastic coefficient may be controlled by controlling or varying an amount of the nanobeads included in the stress control layer 220.

The nanobeads may include at least one of aluminum oxide, silicon oxide, zinc oxide, zirconium oxide, magnesium oxide, and titanium oxide.

In the example embodiment, neutral plane control portions NBP are not evenly formed on one layer in the stress control layer 220, but are spaced from (e.g., spaced apart from) each other in an island shape. In other words, the neutral plane control portions NBP are not continuous along the same plane, and the plurality of nanobeads are arranged into one or more groups, and respective groups may be disposed to be spaced from (e.g., spaced apart from) each other. In the example embodiment, the nanobeads are agglomerated at the protruding portion PP and the depression portion DP to form the neutral plane control portions NBP. Accordingly, even though the stress control layer 220 is hardened, a flexible characteristic may be maintained by inserting nanobeads having a large elastic coefficient.

A method of forming the protection film 200 according to the example embodiment will now be described. The protection film 200 according to the example embodiment is planarized after coating a solution obtained by mixing a material forming the stress control layer 220 and the nanobeads on the support film 210. Thereafter, when the stress control layer 220 is slightly hardened, one surface of the stress control layer 220 is pressurized by a plate having an uneven pattern. In this case, the uneven structure (having the protruding portion PP and the depression portion DP) is formed as one surface of the stress control layer 220 as illustrated in FIG. 2. Because surface energy is greater at the protruding portion PP and the depression portion DP, the nanobeads are easily agglomerated to form the neutral plane control portions NBP at portions adjacent to the protruding portion PP and the depression portion DP. The neutral plane control portion NBP is formed by agglomerating the nanobeads.

The protection film 200, formed as described above, is coupled to (e.g., attached to) the organic light emitting display panel 100 to form the organic light emitting diode display according to the example embodiment of the present invention.

Hereinafter, a detailed structure of the organic light emitting display panel 100 illustrated in FIG. 1 will be described in more detail with reference to FIGS. 4 to 6.

Figure 4:
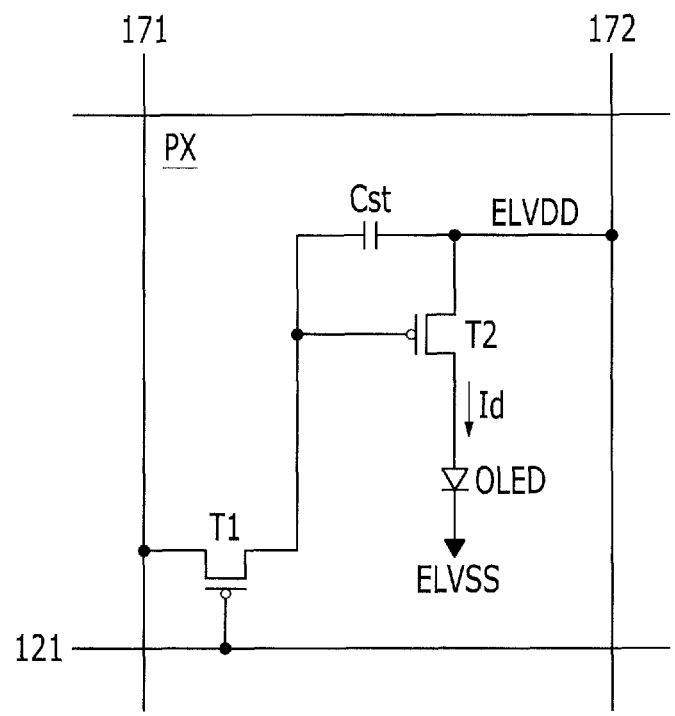
FIG. 4 is an equivalent circuit diagram of one pixel of the organic light emitting diode display according to the example embodiment of the present invention.

FIG. 4 is an equivalent circuit diagram of one pixel of the organic light emitting diode display according to the example embodiment of the present invention.

As illustrated in FIG. 4, the emission implementing layer 400 included in the organic light emitting display panel 100 includes a plurality of signal lines 121, 171, and 172 and a plurality of pixels PX coupled to (e.g., connected to) the signal lines and arranged substantially in a matrix form.

The signal lines include a plurality of scan lines 121 transferring scan signals (or gate signals), a plurality of data lines 171 transferring data signals, and a plurality of driving voltage lines 172 transferring driving voltage ELVDD. The scan lines 121 extend substantially in a row direction and are substantially parallel to each other, and the data lines 171 and the driving voltage lines 172 extend substantially in a column direction and are substantially parallel to each other. Each pixel PX includes a switching thin film transistor T1, a driving thin film transistor T2, a storage capacitor Cst, and an organic light emitting diode OLED.

The switching thin film transistor T1 has a control terminal, an input terminal, and an output terminal, and the control terminal is coupled to (e.g., connected to) the scan line 121, the input terminal is coupled to (e.g., connected to) the data line 171, and the output terminal is coupled to (e.g., connected to) the driving thin film transistor T2. The switching thin film transistor T1 transfers a data signal applied to the data line 171 to the driving thin film transistor T2 in response to a scan signal applied to the scan line 121.

The driving thin film transistor T2 also has a control terminal, an input terminal, and an output terminal, and the control terminal is coupled to (e.g., connected to) the switching thin film transistor T1, the input terminal is coupled to (e.g., connected to) the driving voltage line 172, and the output terminal is coupled to (e.g., connected to) the organic light emitting diode OLED. The driving thin film transistor T2 transmits (e.g., flows) an output current Id having a variable amplitude according to a voltage applied between the control terminal and the output terminal.

The storage capacitor Cst is coupled (e.g., connected) between the control terminal and the input terminal of the driving thin film transistor T2. The storage capacitor Cst charges the data signal applied to the control terminal of the driving thin film transistor T2 and maintains the charged data signal even after the switching thin film transistor T1 is turned off.

The organic light emitting diode OLED has an anode coupled to (e.g., connected to) the output terminal of the driving thin film transistor T2, and a cathode coupled to (e.g., connected to) a common voltage ELVSS. The organic light emitting diode OLED emits light by varying an intensity according to the output current Id of the driving thin film transistor T2 to display an image.

The switching thin film transistor T1 and the driving thin film transistor T2 may be n-channel field effect transistors (FETs) or p-channel field effect transistors. In addition, a connection relationship among the thin film transistors T1 and T2, the storage capacitor Cst, and the organic light emitting diode OLED may be changed or varied.

Also, the thin film encapsulation layer 500 covering the emission implementing layer 400 prevents oxygen and moisture from flowing to or reaching the emission implementing layer 400 from the outside to protect the emission implementing layer 400.

A detailed structure of a pixel of the organic light emitting diode display illustrated in FIG. 4 will be described in more detail with reference to FIGS. 5 and 6 in addition to FIG. 4.

Figure 5:
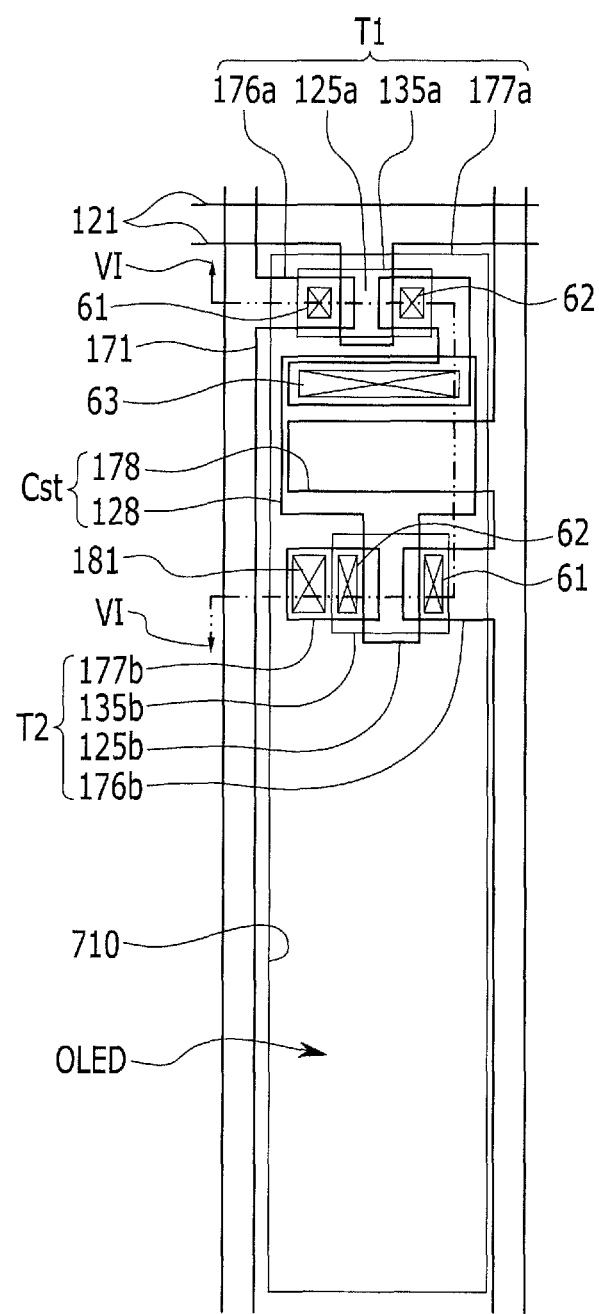
FIG. 5 is a layout view illustrating one pixel of the organic light emitting diode display according to the example embodiment of the present invention.

FIG. 5 is a layout view illustrating one pixel of the organic light emitting diode display according to the example embodiment of the present invention. FIG. 6 is a cross-sectional view taken along the line VI-VI of FIG. 5.

Figure 6:
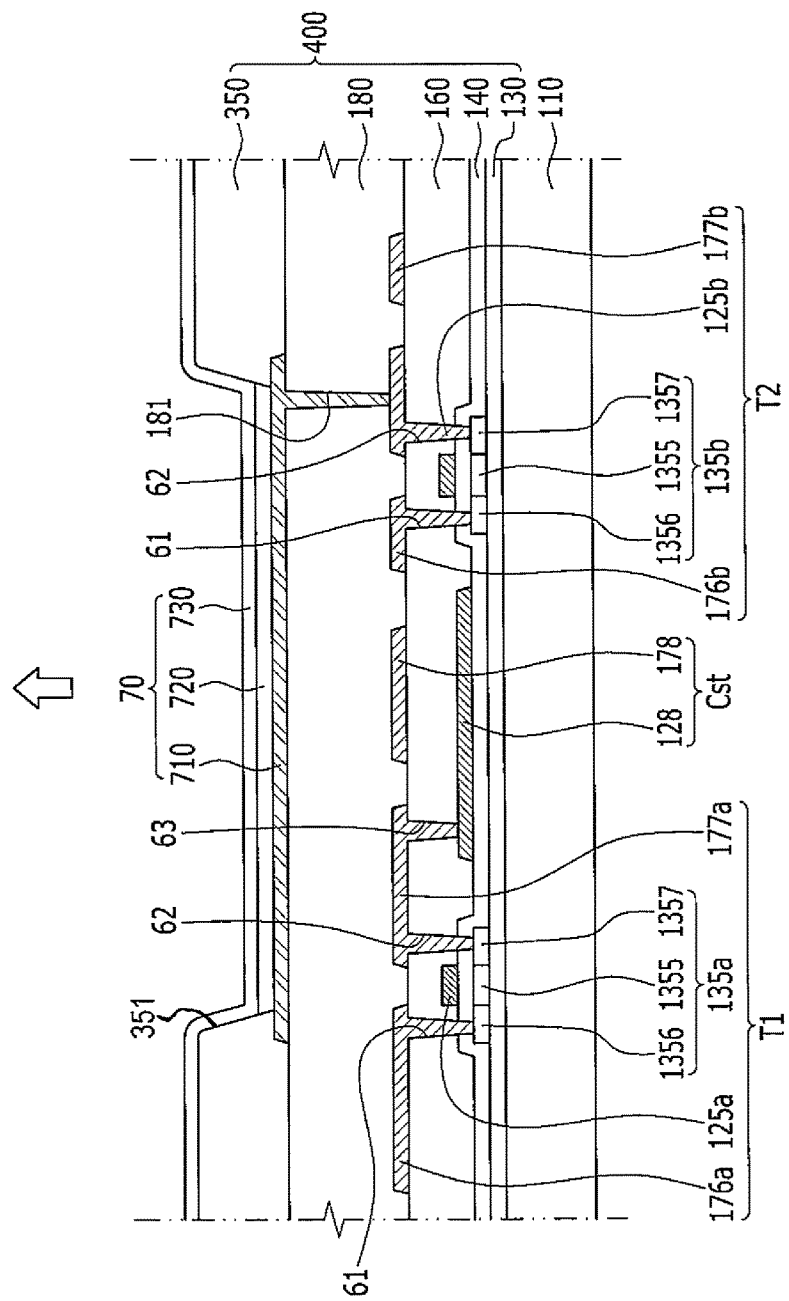
FIG. 6 is a cross-sectional view taken along the line VI-VI of FIG. 5.

As illustrated in FIGS. 5 and 6, the organic light emitting display panel 100 of the organic light emitting diode display according to the example embodiment of the present invention includes the substrate 110, and the emission implementing layer 400 formed on the substrate 110. The substrate 110 may be an insulation substrate such as glass, quartz, and ceramic, or an insulating flexible substrate made of plastic or the like.

A buffer layer 130 may be disposed at a lower end or lower side of the emission implementing layer 400. The buffer layer 130 may be formed as a single layer of silicon nitride ($SiN_x$) or as a double-layer structure in which silicon nitride ($SiN_x$) and silicon oxide ($SiO_2$) are laminated. The buffer layer 130 serves to planarize a surface while preventing an unnecessary component such as an impurity or moisture from penetrating therethrough.

A switching semiconductor layer 135a and a driving semiconductor layer 135b are formed on the buffer layer 130 and are spaced from (e.g., spaced apart from) each other. The semiconductor layers 135a and 135b may be made of polysilicon or an oxide semiconductor. The oxide semiconductor may include one or more oxides based on titanium (Ti), hafnium (Hf), zirconium (Zr), aluminum (Al), tantalum (Ta), germanium (Ge), zinc (Zn), gallium (Ga), tin (Sn), and/or indium (In), and, for example, zinc oxide (Zn—O), indium-gallium-zinc oxide (In—Ga—Zn—O), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and/or hafnium-indium-zinc oxide (Hf—In—Zn—O), these being complex oxides thereof. In the case where the semiconductor layers 135a and 135b are formed of the oxide semiconductor, in order to protect the oxide semiconductor that is vulnerable to an external environmental factors, such as a relatively high temperature, a separate passivation layer may be added.

The semiconductor layers 135a and 135b include a channel region, a source region, and a drain region formed by doping impurities at two sides of the channel region. Herein, the impurities vary according to a kind of thin film transistor, and may be N-type impurities or P-type impurities.

Each of the switching semiconductor layer 135a and driving semiconductor layer 135b is divided into a channel region 1355, a source region 1356, and a drain region 1357. The source region 1356 and the drain region 1357 are formed at both sides of the channel region 1355, respectively. The channel regions 1355 of the switching semiconductor layer 135a and driving semiconductor layer 135b may include polysilicon in which an impurity is not doped, that is, an intrinsic semiconductor, and the source regions 1356 and the drain regions 1357 of the switching semiconductor layer 135a and the driving semiconductor layer 135b may include polysilicon in which a conductive impurity is doped, that is, an impurity semiconductor.

A gate insulating layer 140 is formed on the switching semiconductor layer 135a and the driving semiconductor layer 135b. The gate insulating layer 140 may be a single layer or a multilayer including at least one of silicon nitride and silicon oxide.

A scan line 121, a driving gate electrode 125b, and a first storage capacitor 128 are formed on the gate insulating layer 140. The scan line 121 extends in a horizontal direction, transmits a scan signal, and includes a switching gate electrode 125a protruding from the scan line 121 to the switching semiconductor layer 135a. The driving gate electrode 125b protrudes from the first storage capacitor 128 to the driving semiconductor layer 135b. Each of the switching gate electrode 125a and the driving gate electrode 125b overlaps with the channel region 1355.

An interlayer insulating layer 160 is formed on the scan line 121, the driving gate electrode 125b, and the first storage capacitor 128. Similar to the gate insulating layer 140, the interlayer insulating layer 160 may be made of silicon nitride, silicon oxide, or the like.

In the interlayer insulating layer 160 and the gate insulating layer 140, a source contact hole 61 and a drain contact hole 62 exposing the source region 1356 and the drain region 1357, respectively, are formed, and a storage contact hole 63 exposing a part of the first storage capacitor 128 is formed.

On the interlayer insulating layer 160, a data line 171 having a switching source electrode 176a, a driving voltage line 172 having a driving source electrode 176b and a second storage capacitor 178, and a switching drain electrode 177a and a driving drain electrode 177b coupled with (e.g., connected with) the first storage capacitor 128 are formed.

The data line 171 transfers a data signal and extends in a direction crossing the gate line 121 (e.g., the data line 171 extends substantially perpendicular to the gate line 121). The driving voltage line 172 transfers a driving voltage, is separated from the data line 171, and extends substantially in the same direction as (e.g., parallel to) the data line 171.

The switching source electrode 176a protrudes toward the switching semiconductor layer 135a from the data line 171, and the driving source electrode 176b protrudes toward the driving semiconductor layer 135b from the driving voltage line 172. Each of the switching source electrode 176a and the driving source electrode 176b is coupled to (e.g., connected to) the source region 1356 through the source contact hole 61. The switching drain electrode 177a faces (opposes) the switching source electrode 176a, the driving drain electrode 177b faces (opposes) the driving source electrode 176b, and each of the switching drain electrode 177a and the driving drain electrode 177b is coupled to (e.g., connected to) the drain region 1357 through the drain contact hole 62.

The switching drain electrode 177a extends to be electrically coupled with (e.g., electrically connected with) the first storage capacitor 128 and the driving gate electrode 125b through the contact hole 63 formed in the interlayer insulating layer 160.

The second storage capacitor 178 protrudes from the driving voltage line 171 to overlap with the first storage capacitor 128. Accordingly, the first storage capacitor 128 and the second storage capacitor 178 form the storage capacitor Cst by using (utilizing) the interlayer insulating layer 160 as a dielectric material.

The switching semiconductor layer 135a, the switching gate electrode 125a, the switching source electrode 176a, and the switching drain electrode 177a form the switching thin film transistor T1, and the driving semiconductor layer 135b, the driving gate electrode 125a, the driving source electrode 176b, and the driving drain electrode 177b form the driving thin film transistor T2.

A passivation layer 180 is disposed on the switching source electrode 176a, the driving source electrode 176b, the switching drain electrode 177a, and the driving drain electrode 177b.

A pixel electrode 710 is formed on the passivation layer 180, and the pixel electrode 710 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically coupled with (e.g., electrically connected with) the driving drain electrode 177b of the driving thin film transistor T2 through the contact hole 181 formed in the interlayer insulating layer 160 to become an anode of an organic light emitting diode 70.

A pixel defining layer 350 is disposed on the passivation layer 180 and an edge of the pixel electrode 710. The pixel defining layer 350 has an opening 351 exposing the pixel electrode 710. The pixel defining layer 350 may include a resin such as a polyacrylate or a polyimide, a silica-based inorganic material, and/or the like.

An organic emission layer 720 is formed in the opening 351 of the pixel defining layer 350. The organic emission layer 720 is formed as a multilayer structure including an emission layer and/or one or more of a hole-injection layer (HIL), a hole-transporting layer (HTL), an electron-transporting layer (ETL), and an electron-injection layer (EIL). In the case where the organic emission layer 720 includes all the layers, the hole-injection layer is disposed on the pixel electrode 710 which is an anode, and the hole-transporting layer, the emission layer, the electron-transporting layer, and the electron-injection layer may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are formed as a red pixel, a green pixel, and a blue pixel, respectively, thereby implementing a color image.

Further, the organic emission layer 720 may implement the color image by laminating the red organic emission layer, the green organic emission layer, and the blue organic emission layer together in each of the red pixel, the green pixel, and the blue pixel, and forming a red color filter, a green color filter, and a blue color filter for each pixel. As another example, white organic emission layers emitting white light are formed in each of the red pixel, the green pixel, and the blue pixel, and a red color filter, a green color filter, and a blue color filter are formed for (e.g., correspond to) each pixel, thereby implementing the color image. In the case of implementing the color image by using (utilizing) the white organic emission layer and the color filters, a deposition mask for depositing the red organic emission layer, the green organic emission layer, and the blue organic emission layer on respective pixels, that is, the red pixel, the green pixel, and the blue pixel does not need to be utilized.

The white organic emission layer described in another example embodiment may be formed by an organic emission layer, and includes a configuration in which a plurality of organic emission layers are laminated to emit white light. For example, the white organic emission layer may include a configuration which may emit white light by combining at least one yellow organic emission layer and at least one blue organic emission layer, a configuration which may emit white light by combining at least one cyan organic emission layer and at least one red organic emission layer, a configuration which may emit white light by combining at least one magenta organic emission layer and at least one green organic emission layer, or the like.

A common electrode 730 is formed on the pixel defining layer 350 and the organic emission layer 720. The common electrode 730 may be made of a transparent conductive material such as indium tin oxide (ITO), indium zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 becomes a cathode of the organic light emitting diode 70. The pixel electrode 710, the organic emission layer 720, and the common electrode 730 are configured to form the organic light emitting diode 70.

The organic light emitting diode display is described above, but the contents related with the protection film are not necessarily limited to the organic light emitting diode display. The contents related with the protection film may be applied to a flexible display device or various display devices as long as a stress due to a force applied from the outside (e.g., an external force) needs to be reduced.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

| Description of Reference Numerals | | | |
|---|---|---|---|
| 100 | Organic light emitting display panel | 110 | Flexible substrate |
| 130 | Buffer layer | 200 | Protection film |
| 210 | Support film | 220 | Stress control layer |
| 400 | Emission implementing layer | 500 | Thin film encapsulation layer |

What is claimed is:
1. A display device comprising:
a display panel configured to display an image; and
a protection film coupled to a lower portion of the display panel,
wherein the protection film comprises:
a support film contacting the display panel, and
a stress control layer below the support film,
wherein a surface of the stress control layer comprises an uneven structure, and wherein the stress control layer comprises a plurality of nanobeads, the plurality of nanobeads being agglomerated at the uneven structure.

2. The display device of claim 1, wherein:
the uneven structure comprises a protruding portion and a depression portion.

3. The display device of claim 2, wherein:
a group of the plurality of nanobeads is agglomerated to form a neutral plane control portion, and the neutral plane control portion is at the protruding portion and/or the depression portion.

4. The display device of claim 3, wherein:
the neutral plane control portion comprises a plurality of neutral plane control portions, and the plurality of neutral plane control portions are spaced from each other.

5. The display device of claim 4, wherein:
the nanobeads comprise a metal oxide.

6. The display device of claim 5, wherein:
the nanobeads comprise at least one of aluminum oxide, silicon oxide, zinc oxide, zirconium oxide, magnesium oxide, or titanium oxide.

7. The display device of claim 6, wherein:
the stress control layer comprises the nanobeads mixed in at least one of a UV epoxy-based material, a urethane acrylate-based material, or acrylate-based material.

8. The display device of claim 7, wherein:
the support film comprises at least one of polyethylene terephthalate (PET), polypropylene (PP), polyethylene (PE), polyethersulfone (PES), or polycarbonate (PC).

9. The display device of claim 4, wherein:
a neutral plane is in the display panel.

10. The display device of claim 1, wherein:
the display panel is an organic light emitting display panel.

11. The display device of claim 10, wherein:
the organic light emitting display panel comprises:
 a flexible substrate coupled to the protection film,
 an organic light emitting diode on the flexible substrate, and
 a thin film encapsulation layer covering the organic light emitting diode.

12. The display device of claim 1, wherein:
an elastic coefficient of the stress control layer is varied according to an amount of the nanobeads in the stress control layer.

13. A display device comprising:
a protection film; and
an organic light emitting display panel comprising:
 a thin film encapsulation layer;
 a flexible substrate between the thin film encapsulation layer and the protection film; and
 an organic light emitting diode between the flexible substrate and the thin film encapsulation layer,
wherein the protection film comprises:
 a stress control layer comprising a plurality of nanobeads; and
 a support film between the display panel and the stress control layer,
wherein a surface of the stress control layer has an uneven structure, and
wherein the nanobeads are agglomerated at the uneven structure.

14. A method of forming a display device, the method comprising:
forming a protection film to include a support film and a stress control layer, the stress control layer comprising a plurality of nanobeads; and
coupling the protection film to a lower portion of a display panel by contacting the support film to the display panel and arranging the stress control layer below the support film,
wherein a surface of the stress control layer is formed to have an uneven structure, and
wherein the nanobeads are agglomerated at the uneven structure.

15. The method of claim 14, wherein the forming of the protection film comprises controlling an elastic coefficient of the stress control layer by varying an amount of the nanobeads in the stress control layer.

16. The method of claim 14, wherein the forming the protection film comprises mixing a material forming the stress control layer and the plurality of nanobeads on the protection film;
planarizing the protection film; and
when the stress control layer has partially hardened, forming one side of the stress control layer to have the uneven structure utilizing a mold.

* * * * *